United States Patent
Yang et al.

(10) Patent No.: US 6,245,617 B1
(45) Date of Patent: Jun. 12, 2001

(54) METHOD OF FABRICATING DIELECTRIC LAYER

(75) Inventors: Yi-Chang Yang, Taipei; Tang Yu, Hsinchu Hsien, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/306,253

(22) Filed: May 6, 1999

(51) Int. Cl.[7] .................. H01L 21/336; H01L 21/8236; H01L 21/31; H01L 21/469

(52) U.S. Cl. .................. 438/287; 438/261; 438/287; 438/775; 438/954

(58) Field of Search ................... 438/261, 287, 438/775, 791, 954

(56) References Cited

U.S. PATENT DOCUMENTS 5,578,848 * 11/1996 Kwong et al. .................. 257/296
5,981,403 * 11/1999 Ma et al. .................. 438/758
6,051,511 * 4/2000 Thakur et al. .................. 438/791

OTHER PUBLICATIONS

Wolf, Silicon Processing for the VLSI Era, vol. 1; Process Technology, Wolf et al.pp. 516–517, 1986, No Month.*

* cited by examiner

Primary Examiner—Richard Booth
Assistant Examiner—Alexander G. Ghyka
(74) Attorney, Agent, or Firm—Jiawei Huang; J.C. Patents

(57) ABSTRACT

A method of fabricating a dielectric layer is provided. A first oxide layer is formed on a polysilicon layer. A silicon-rich nitride layer is formed on a first oxide layer. A silicon-poor nitride layer is formed on the silicon-rich nitride layer. An oxidation step is performed on the silicon-poor nitride layer. A second oxide layer is formed on the silicon-poor nitride layer. The dielectric layer comprising a multiple nitride layer structure is formed.

13 Claims, 1 Drawing Sheet

METHOD OF FABRICATING DIELECTRIC LAYER

BACKGROUND OF THE INVENTION

1. Field of the Invention

The present invention relates to a semiconductor fabricating method. More particularly, the present invention relates to a method of fabricating a dielectric layer comprising a multiple nitride layer structure.

2. Description of the Related Art

Dielectric layers are widely used in integration circuits. The quality and the structure of the dielectric layers are important factors for a integration circuit fabrication. For example, in a DRAM fabrication process, a cell comprises a transistor and a capacitor. The capacitor comprises a dielectric layer between a top electrode and a bottom electrode. The thickness and the structure of the dielectric layer used in the capacitor affect the capacity and the quality of the capacitor. The dielectric layer is used to store electrons. Electron storage capacity is related to the dielectric constant and the thickness of the dielectric layer. In addition, the time for preserving the storage electrons is affected by the quality of the dielectric layer. Thus, it is desirable to fabricate an improved dielectric layer.

In a current fabrication process of an integration circuit, the frequently used materials of the dielectric layer are oxide and nitride. Because the nitride has low dielectric constant and the oxide has a good adhesion ability, an oxide/nitride/oxide structure are commonly used in the dielectric layer of the capacitor.

FIG. 1 is a schematic, cross-sectional view of a conventional dielectric layer comprising an oxide/nitride/oxide structure.

In FIG. 1, a RCA cleaning step is performed on a polysilicon layer 100. A HF surface treatment is performed on the polysilicon layer 100. A native oxide layer is formed on the polysilicon layer 100. The native oxide layer serves as a first oxide layer 102 of the conventional dielectric layer. A nitride layer 104 is formed on the first oxide layer 102 by deposition with a mixed gas source. The mixed gas source is mixed from $SiH_2Cl_2$ and $NH_3$ having a ratio of 1:10. A portion of the nitride layer 104 on the surface is oxidized. A second oxidation layer 106 thus is formed on the nitride layer 104. A dielectric layer comprising an oxide/nitride/oxide structure is formed.

In the conventional dielectric layer, only one nitride layer is used. Once defects are formed in the nitride layer, or the nitride layer is damaged in a subsequent step, current leakage is likely to occur. The current leakage causes the electrons stored in the capacitor to be lost. This, in turn, reduces the electron-preserving time for the capacitor. Therefore, the electron-refreshing step must be performed more frequently. However, frequently performing the electron-refreshing step decreases the operation speed. Thus, problems are still encountered.

SUMMARY OF THE INVENTION

The invention provides a method of fabricating a dielectric layer. A RCA cleaning step is performed on a polysilicon layer to remove impurities on the polysilicon layer. A HF surface treatment step is performed on the polysilicon layer. While performing the HF surface treatment step, a native oxide layer is formed on the polysilicon layer. The native oxide layer serves as a first oxide layer. A first mixed gas source is mixed from $SiH_2Cl_2$ and $NH_3$ having a ratio of 1:3. Chemical vapor deposition is performed with the first mixed gas source to form a silicon-rich nitride layer on the first oxide layer. An $NH_3$ surface treatment is performed on the silicon-rich nitride layer to remove the native oxide layer on the silicon-rich nitride layer and improve the adhesion ability of the silicon-rich nitride layer. A second mixed gas source is mixed from $SiH_2Cl_2$:$NH_3$ having a preferred ratio of about 1:10 to 1:20. Chemical vapor deposition is performed to form a silicon-poor nitride layer on the silicon-rich nitride layer. After the silicon-poor nitride layer is formed, an $NH_3$ surface treatment is performed on the silicon-poor nitride layer. An oxidation step is performed on the surface of the silicon-poor nitride layer. A portion of the silicon-poor nitride layer is oxidized into a second oxide layer. A dielectric layer having a multiple nitride layer structure is formed.

The present invention forms the silicon-rich nitride layer and the silicon-poor nitride layer with the first and the second mixed gas sources, respectively. The first and the second mixed gas sources are mixed from $SiH_2Cl_2$ and $NH_3$ with different ratios. The silicon-rich nitride layer enhances the adhesion ability for the first oxide layer. The silicon-rich nitride layer and the silicon-poor nitride layer together form a multiple nitride layer structure. The multiple nitride layer structure decreases the paths for current to flow into the oxide layer or the polysilicon layer during current leakage. Thus, the multiple nitride layer structure prevents the occurrence of current leakage.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
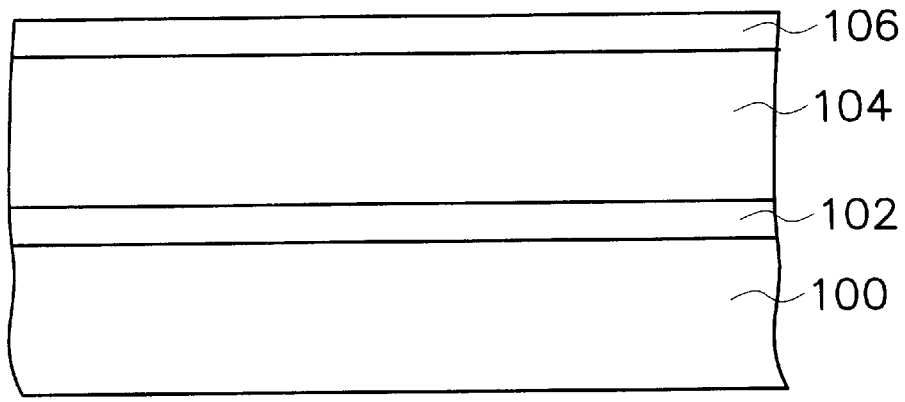
FIG. 1 is a schematic, cross-sectional view of a conventional dielectric layer comprising an oxide/nitride/oxide structure.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
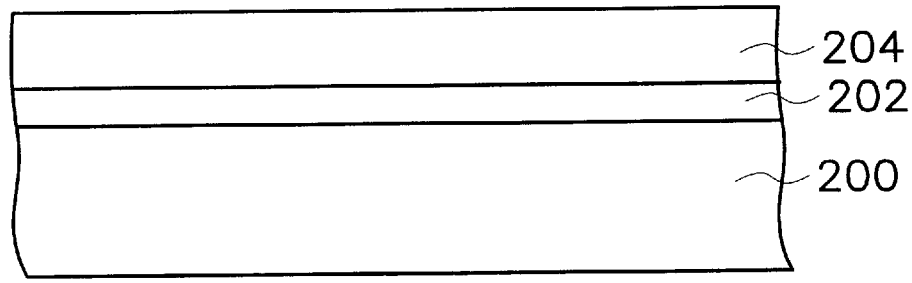
FIGS. 2A through 2B are schematic, cross-sectional views showing a method of fabricating a dielectric layer comprising a multiple nitride layer structure according to one preferred embodiment of the invention.

In FIG. 2A, a cleaning step is performed on a polysilicon layer 200 to remove the impurities on the polysilicon layer. The cleaning step is preferably an RCA cleaning step. A HF surface treatment step is performed on the polysilicon layer 200. While performing the HF surface treatment step, a native oxide layer is formed on the polysilicon layer 200. The native oxide layer serves as a first oxide layer 202. A silicon-rich nitride layer 204 is formed on the first oxide layer 202. The silicon-rich nitride layer 204 can be formed by the following exemplary steps. A first mixed gas source is mixed from $SiH_2Cl_2$ and $NH_3$ having a preferred ratio of about 1:3. A chemical vapor deposition is performed with the first mixed gas source to form the silicon-rich nitride layer 204. An $NH_3$ surface treatment is performed on the silicon-rich nitride layer 204 to remove the native oxide layer on the silicon-rich nitride layer 204. The adhesion ability of the silicon-rich nitride layer 204 thus is improved.

Figure 2B:
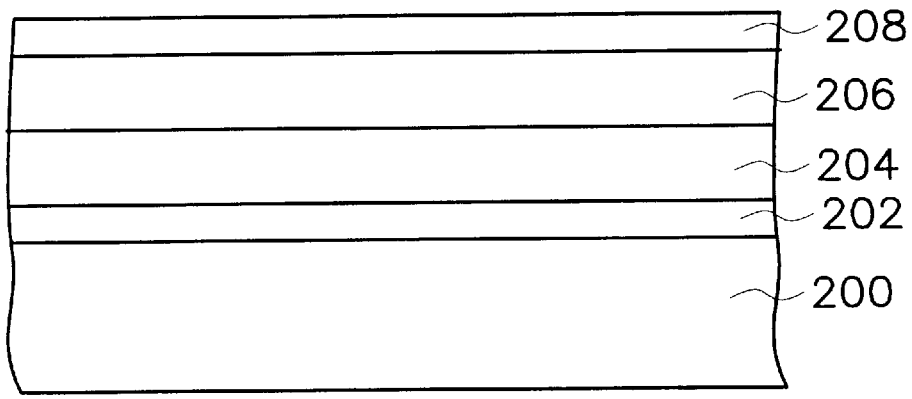

In FIG. 2B, a silicon-poor nitride layer 206 is formed on the silicon-rich nitride layer 204. The silicon-poor nitride layer 206 can be formed by, for example, chemical vapor deposition with a second mixed gas source. The second mixed gas source is mixed from $SiH_2Cl_2$ and $NH_3$ having a preferred ratio of about 1:10 to 1:20. After the silicon-poor nitride layer 206 is formed, an $NH_3$ surface treatment is performed on the silicon-poor nitride layer 206. An oxidation step is performed on the surface of the silicon-poor nitride layer 206. A portion of the silicon-poor nitride layer 206 is oxidized into a second oxide layer 208. The silicon-rich nitride layer 204 and the silicon-poor nitride layer 208 together form a multiple nitride layer structure. A dielectric layer comprising the multiple nitride layer structure is formed.

The advantage of the present invention is to form a dielectric layer comprising a multiple nitride layer structure, which comprises a silicon-rich nitride layer and a silicon-poor nitride layer. The silicon-rich nitride layer and the silicon-poor nitride layer are formed with a first and a second mixed gas sources, respectively. The first and the second mixed gas sources are mixed from $SiH_2Cl_2$ and $NH_3$ having different ratios. Because the multiple nitride layer structure is formed, the amount of paths for current to pass through is decreased. Thus, current leakage from the dielectric layer is significantly reduced.

For example, the total thickness of the silicon-rich nitride layer and the silicon-poor nitride layer in the invention is substantially the same as the thickness of the nitride layer in the conventional method. As the capacity and the breakdown voltage are fixed, a capacitor utilizing the dielectric layer of the present invention is found to have a smaller current leakage compared with a capacitor utilizing the conventional dielectric layer. Specifically, a first capacitor, comprising a dielectric layer formed by the present invention, has a capacity of 54.5 fF. A second capacitor, comprising a conventional dielectric layer, has the same capacity of 54.5 fF. The first capacitor and the second capacitor are respectively supplied with the same voltage of about 1.5 V. It is found that the current leakage of the second capacitor is about $5.58 \times 10^{-12}$ mA. However, the current leakage of the first capacitor, comprising a dielectric layer formed by the present invention, is reduced to about $5.15 \times 10^{-12}$ mA.

Accordingly, when the thickness of the silicon-rich nitride layer plus the siliconpoor nitride layer of the dielectric layer in the invention is the same as the thickness of the conventional nitride layer. The current leakage is reduced by 10% compared to the conventional method. Thus, it is obvious that the present invention is advantageous for reducing the current leakage of the dielectric layer. The quality of the dielectric layer is further enhanced by the present invention.

The above-described preferred embodiment takes the silicon-rich nitride layer 204 and silicon-poor nitride layer 206 for example but any other multiple nitride layer can also be formed. The current leakage of devices can also be decreased by forming a multiple nitride layer.

It will be apparent to those skilled in the art that various modifications and variations can be made to the structure and the method of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a dielectric layer, the method comprising the steps of:

forming a first oxide layer on a polysilicon layer;

forming a silicon-rich nitride layer on the first oxide layer;

performing a NH3 surface treatment onto the first nitride layer;

forming a silicon-poor nitride layer on the silicon-rich nitride layer;

performing a NH3 surface treatment onto the second nitride layer; and forming a second oxide layer on the silicon-poor nitride layer.

2. The method of claim 1, wherein the first oxide layer is formed by first performing a RCA cleaning step on the polysilicon layer, and then performing a HF surface treatment step on the polysilicon layer.

3. The method of claim 1, wherein the silicon-rich nitride layer is formed by chemical vapor deposition with a first mixed gas source, wherein the first mixed gas source is mixed from $SiH_2Cl_2$ and $NH_3$ having a ratio ranging from about 1:1 to about 1:10.

4. The method of claim 3, wherein the silicon-rich nitride layer is formed by chemical vapor deposition with a first mixed gas source, wherein the first mixed gas is mixed from $SiH_2Cl_2$ and $NH_3$ having a ratio of about 1:3.

5. The method of claim 1, wherein the silicon-poor nitride layer is formed by chemical vapor deposition with a second mixed gas, wherein the second mixed gas is mixed from $SiH_2Cl_2$ and $NH_3$ having a ratio ranging from about 1:10 to about 1:20.

6. The method of claim 1, wherein the step of forming the second oxide layer comprises performing an oxidation step on the silicon-poor nitride layer.

7. The method of claim 1, wherein the step of forming the second oxide layer comprises performing an oxidation step to oxidize a portion of the silicon-poor nitride layer into oxide.

8. A method of fabricating a multiple nitride layer structure, the method comprising the steps of:

forming a first nitride layer on an oxide layer;

performing a NH3 surface treatment onto the first nitride layer;

forming a second nitride layer on the first nitride layer, wherein the first nitride layer has a higher silicon ratio than the second nitride layer;

performing a NH3 surface treatment onto the second nitride layer; and oxidizing the second nitride layer into a second oxide layer.

9. The method of claim 8, wherein the first nitride layer is formed by chemical vapor deposition with a first mixed gas source, wherein the first mixed gas source is mixed from $SiH_2Cl_2$ and $NH_3$ having a ratio ranging from about 1:1 to about 1:10.

10. The method of claim 9, wherein the first nitride layer is formed by chemical vapor deposition with a first mixed gas source, wherein the first mixed gas is mixed from $SiH_2Cl_2$ and $NH_3$ having a ratio of about 1:3.

11. The method of claim 8, wherein the second nitride layer is formed by chemical vapor deposition with a second mixed gas source, wherein the second mixed gas is mixed from $SiH_2Cl_2$ and $NH_3$ having a ratio ranging from about 1:10 to about 1:20.

12. The method of claim 8, wherein a second oxide layer is further formed through oxidizing a portion of the second nitride layer.

13. The method of claim 8, further comprising forming a multiple nitride layer including the first and second nitride layers on the oxide layer.

* * * * *